CLOCKED SET-RESET FLIP-FLOP
Filed April 30, 1964
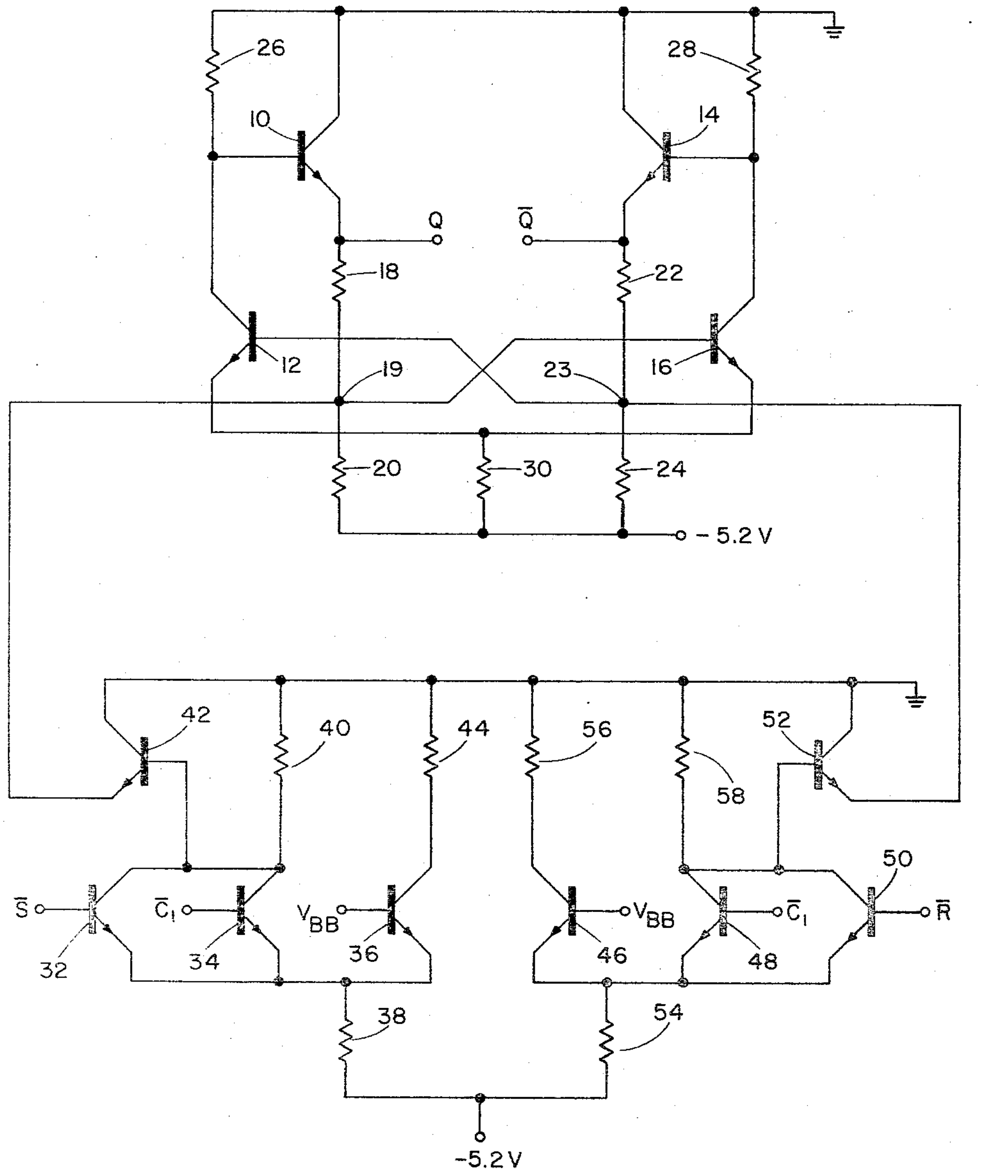
INVENTORS
Jan A. Narud
Walter C. Seelbach
BY
Mueller & Aichele
ATT'YS.

3,307,047
CLOCKED SET-RESET FLIP-FLOP
Jan A. Narud and Walter C. Seelbach, Scottsdale, Ariz., assignors to Motorola, Inc., Chicago, Ill., a corporation of Illinois
Filed Apr. 30, 1964, Ser. No. 363,958
6 Claims. (Cl. 307—88.5)

The present invention relates to bi-stable multivibrators, and it relates more particularly to an improved bi-stable multivibrator utilizing emitter-coupled logic circuitry and especially adapted to integrated circuit construction.

There has been substantial progress in recent years in the field of integrated circuits. An integrated circuit comprises a substrate of a suitable semiconductor material of a particular conductivity type, and it further includes a plurality of p-n junctions formed in the substrate to constitute circuit elements, such as diodes and transistors.

Copending application Serial No. 273,033, filed April 15, 1963, assigned to the present assignee, discloses and claims improved emitter-coupled logic circuitry which is particularly constructed to utilize the inherent advantages of integrated circuits. The emitter-coupled logic circuitry described in the copending application is constructed in a manner such that instabilities inherent in present day integrated circuits are compensated. The bi-stable multivibrator of the present invention utilizes similar emitted-coupled logic circuitry.

The usual prior art integrated logic circuitry is also subject to further limitations. For example, parasitic coupling between the various parts of the circuits through neighboring regions and through the substrate itself create problems. This parasitic coupling, for example, tends to reduce the operational response speed of the usual prior art integrated circuit. This reduction in response speed is particularly prevalent when the impedance of the particular integrated circuit is high at the point where the logical connections are made.

In addition, the integrated circuit is normally sensitive to changes in ambient conditions. This is because the characteristics of the semiconductor material in the substrate, and of the circuit elements themselves vary with temperature. Therefore, the transfer characteristic of the integrated circuit is normally susceptible to change without variations in temperature.

The bi-stable multivibrator of the present invention may be constructed to incorporate high speed integrated circuit logic blocks of the aforementioned emitter coupled type described in the aforementioned copending application. These logic blocks capitalize on integrated circuit advantages and compensate for the above-mentioned limitations thereof. The blocks are reliable and relatively insensitive to variations in component values due to environmental and aging effects. Moreover, in order to produce the logic blocks with a reasonable yield, the tolerance requirements are relatively large. In addition, the propagation time through the logic blocks is small, with power dissipation being maintained at a minimum.

The bi-stable multivibrator to be described herein is similar in some respect to the multivibrator described in copending application 363,959, filed April 30, 1964, and assigned to the present assignee. However, the multivibrator of this application is especially adapted for clocking rather than direct set-reset action.

The bi-stable multivibrator to be described consists essentially of two cross-coupled gates. The basic multivibrator to be described performs clocked, "set" and "reset" operations.

The bi-stable multivibrator, or "flip-flop" as it is usually called, has gained wide acceptance in the present day electronic art, especially in the field of electronic digital computers, data processors, and the like. The usual bi-stable multivibrator is an Eccles-Jordan relaxation oscillator; and it may be transistorized and incorporated into an integrated circuit construction, as explained above.

The two stable states of the bi-stable multivibrator are generally referred to as the "set" and "reset" states. The bi-stable multivibrator is usually triggered to its set state by an input signal applied to its set input terminal; and it remains in that state until a "reset" signal applied to its reset input terminal returns the multivibrator to its reset state. In some applications, appropriate steering networks are used in the bi-stable multivibrator, so that successive toggle pulses applied to a single input terminal can trigger the multivibrator successively between its set and reset states for counting and related purposes.

An object of the present invention is to provide an improved bi-stable multivibrator which is particularly adapted to be constructed so as to incorporate integrated circuit emitter-coupled logic blocks.

A further object of the invention is to provide such an improved multivibrator which is capable of operating on relatively low power, requires a minimum of components, and which is relatively inexpensive to construct and which may be sold at a relatively low price.

Another object of the invention is to provide such an improved bi-stable multivibrator of the set-reset type which has a direct clocking capability.

Yet another object of the invention is to provide such an improved bi-stable multivibrator which is capable of relatively high speed operation for use in present day high speed digital computers.

Another object of the invention is to provide such an improved bi-stable multivibrator which may be triggered from one state to another when the amplitude of the triggering clock signal equals one-half its logic swing, thereby providing optimum noise immunity versus amplitude sensitivity.

A feature of the invention is the provision of such an improved bi-stable multivibrator which incorporates tapped emitter follower resistors to provide the half logic shift, direct clock triggering of the multivibrator, rereferred to in the preceding paragraph.

Other features and advantages of the invention will become apparent from a consideration of the following description, when the description is taken in conjunction with the accompanying drawing, in which the single figure illustrates one embodiment of a set-reset emitter-coupled bi-stable multivibrator circuit constructed in accordance with the present invention.

The circuit illustrated in the drawing includes a basic bi-stable multivibrator circuit comprising a plurality of NPN transistors 10, 12, 14 and 16. These transistors may be of the silicon diffused junction type, as may the other transistors utilized in the multivibrator circuit, and they may be formed on an appropriate substrate, in accordance with usual integrated circuit techniques.

The transistors 10 and 14 are connected as emitter followers, and each includes tapped emitter follower resistors, represented by the resistors 18, 20 and 22, 24 respectively. The resistors 18 and 20 are connected between the emitter of the transistor 10 and the negative terminal of a unidirectional voltage source. The voltage may have a value, for example, of 5.2 volts. Likewise, the resistors 22 and 24 are connected between the emitter of the transistor 14 and the negative terminal of the voltage source. The resistors 18 and 22 may each have a resistance of 180 ohms, and the resistors 20 and 24 may each have a resistance of 1820 ohms.

The output terminal Q of the bi-stable multivibrator is connected to the emitter of the transistor 10, whereas the complementary output terminal $\overline{Q}$ is connected to the emitter of the transistor 14.

The transistors 12 and 16 function as cross-coupling transistors, the transistor 16 serving to couple the common junction of the resistors 18 and 20 to the base of the transistor 14; and the transistor 12 serving to intercouple the common junction of the resistors 22 and 24 to the base of the transistor 10.

As mentioned, the transistors 10 and 14 are connected as emitter followers and, to that end, the collectors of the transistors are connected to a point of reference potential, such as ground. The positive terminal of the 5.2 volt direct voltage source is also connected to that point of direct current voltage potential. The bases of the output transistors 10 and 14 are connected to respective 300 ohm grounded resistors 26 and 28. The emitters of the cross-coupling transistors 12 and 16 are connected through a resistor 30 to the negative terminal of the 5.2 volt direct voltage source. The resistor 30 may have a resistance of 1240 ohms.

The circuit of the accompanying drawing also includes the necessary logic gates to provide the desired clocked set and reset functions. The set gate, for example, may include a plurality of NPN transistors 32, 34 and 36. These transistors likewise may be of the diffused junction type.

The transistor 32 and the transistor 34 are connected as a logic gate, as mentioned above; and these transistors, together with the transistor 36, are connected as a current mode switching circuit such as described in the aforementioned copending application Serial No. 273,033. The collectors of the transistors 32 and 34 are connected to a resistor 40, and the collector of the transistor 36 is connected to a resistor 44. These resistors are grounded. A common emitter resistor 38, connected to the negative terminal of a 5.2 volt source is also provided. The resistors 40 and 44 may each be 300 ohms. The resistor 38 may be 1240 ohms.

The set input signal is applied to the base of the transistor 32, and the clock pulses are applied to the base of the transistor 34. The collectors of the transistors 32 and 34 are connected to the base of an emitter follower transistor 42. The aforementioned resistor 20 serves as the emitter resistor for the transistor 42.

An appropriate voltage regulating circuit, such as described in the copending application Serial No. 273,033, applies a regulated bias voltage ($V_{BB}$) to the base of the transistor 36.

The reset logic gate incorporates the transistors 46, 48 and 50; and these transistors are connected in the same manner as the corresponding transistors in the set gate. Resistor 54 is in the common current supply path to the emitters of transistors 46, 48 and 50. Resistor 56 is the load for transistor 46, and resistor 58 is the load resistance for transistors 48 and 50. The reset signal is applied to the base of the transistor 50, and the clock signal is applied to the base of the transistor 48.

An emitter follower transistor 52 couples the reset gate to the common junction 23 of the resistors 22 and 24. The gate applies a reset trigger signal to the junction 23 when the signal $\overline{R}$ is true (at its negative level) and when the clock signal $\overline{C}_1$ swings negatively to its true state.

In describing the operation of the multivibrator, it will be assumed that it is initially in its set state. The transistors are a diffused silicon type with an offset voltage of approximately 0.7 volt. The transistor 12 is non-conductive, and the transistor 16 is conductive. There is a zero voltage on the base of the transistor 10 and —0.7 volt on its emitter due to the offset voltage of the transistor. Likewise, there is —0.8 volt on the base of the transistor 14, which produces —1.5 volts on its emitter due to the offset voltage.

It is to be noted that the transistors 10 and 14 are connected as emitter followers; and the potentials on their emitters, therefore, follow the potentials applied to their base electrodes. Under the aforementioned conditions, the output $\overline{Q}$ is at —1.5 volts and the output Q is at —1.5 volts.

The operation will be described starting with the condition in which the set, reset and clock inputs are initially at their more positive voltage level, which may be —0.7 volt for a particular embodiment. Transistors 32, 34, 48 and 50 are then conducting, and —0.8 volt appears on the bases of transistors 42 and 52. The value of resistor 18 is chosen such that the voltage at the tap point 19 is —1.1 volts. The latter voltage appears on the emitter of transistor 42. The emitter-base voltage of the latter transistor is .3 volt so it is off. The voltage at tap point 23 is clamped at —1.5 volts which appears at the emitter of transistor 52 due to its offset voltage.

Assume that a negative-going reset pulse is applied to the reset input terminal $\overline{R}$ to cut transistor 50 off. When the next negative-going clock pulse appears on the base of transistor 48, that transistor is turned off and its collector voltage swings positive. The base of transistor 52 rises to 0 volt, so its emitter goes positive and tends to drive the tap point 23 in the positive direction. This voltage appears on the base of transistor 12 and turns it on such that the voltage at the Q output swings negative to the —1.5 volt level. The voltage at tap point 19 drops to —1.5 volts, thus cutting off transistor 16 which in turn drives the base and emitter of transistor 14 positive so that the $\overline{Q}$ ouput rises to the binary one level (—0.7 volt). The transistor 14 clamps the voltage at point 23 at —1.1 volts. When the clock signal goes positive again, transistor 52 turns off since it has —0.8 volt on its base and —1.1 volts on its emitter.

The multivibrator of the invention, therefore, is capable of responding to a direct clock signal, as the clock signal shifts its logic level from one value to another. The tapped connections to the emitter resistors 18, 20, and 22, 24 permits the multivibrator to shift state when the clock signal amplitude passes through one-half of its logic swing. This provides for optimum noise immunity for given signal amplitudes. In addition, the emitter-follower connections for transistors 42 and 52 enable resistors 20 and 24 to simultaneously serve as the emitter resistance for transistors 10 and 42 and transistors 14 and 52, respectively. These connections are advantageous in maintaining the circuit power dissipation at a minimum by utilizing a minimum number of resistive components.

The invention provides, therefore, an improved multivibrator circuit which is particularly adapted to integrated circuit construction and which utilizes emitter coupled current mode switching gate circuitry for that purpose.

While a particular embodiment has been described, modifications may be made. These are intended to be covered in the claims.

What is claimed is:

1. A clocked bistable multivibrator circuit having set and reset conductive states, said circuit including in combination first and second emitter-follower transistors and first and second holding transistors, said first and second holding transistors connected to a common current output terminal, a common emitter resistance connected between said common current output terminal and a voltage supply means, means cross-coupling said first and second emitter-follower transistors to said second and first holding transistor, repectively, and providing a conductive path in said multivibrator during the alternate conduction of said first and second holding transistors, said bistable multivibrator having a first stable set state wherein said first holding transistor is conducting and said second holding transistor is non-conducting and a second stable reset state wherein said first holding transistor is non-conducting and said second holding transistor is conducting, said cross-coupling means including a first resistance means connected between said first emitter-follower transistor and said voltage supply means.

and a second resistance means connected between said second emitter-follower transistor and said voltage supply means, and current mode gating means including an output transistor conductively controlled by a source of clock signals, said output transistor having a current output electrode connected directly to one of said first and second resistance means in an emitter-follower configuration and enabling said one of said first and second resistance means to simultaneously serve as a common emitter-follower resistance for said output transistor and for one of said first and second emitter-follower transistors, thereby maintaining the overall power dissipation in said multivibrator circuit at a minimum.

2. The circuit according to claim 1 wherein said first resistance means is connected directly at an intermediate point thereon to said second holding transistor and said second resistance means is connected directly at an intermediate point thereon to said first holding transistor, and said output electrode of said output transistor directly connected to one of said intermediate points on said first and second resistance means for controlling the conductive state of one of said first and second holding transistors.

3. A clocked bistable multivibrator circuit having set and reset conductive states, said circuit including in combination first and second signal output transistors each having emitter, base and collector electrodes and first and second holding transistors each having an emitter, base and collector electrodes, said emitter electrodes of said first and second holding transistors connected to common output terminal, a common emitter resistance connected between said common output terminal and a voltage supply means, means cross-coupling said emitter electrode of said first signal output transistor to said base electrode of said second holding transistor and further cross-coupling said emitter electrode of said second signal output transistor to said base electrode of said first holding transistor, first and second base bias resistors connected respectively between said base electrodes of said first and second signal output transistors and a point of reference potential, said collector electrode of said first and second signal output transistors connected to said point of reference potential, said cross-coupling means including first resistance means connected between said emitter electrode of said first signal output transistor and said voltage supply means and a second resistance means conected between said emitter electrode of said second signal output transistor and said voltage supply means, and current mode switching means including an output emitter-follower transistor having the conductive state thereof controlled by a source of clock signals, said emitter-follower output transistor having an emitter electrode thereof connected directly to one of said first and second resistance means in said multivibrator circuit and enabling said one of said first and second resistance means to simultaneously serve as a common emitter resistance for one of said first and second signal output transistors and said emitter-follower transistor within said current mode switching means thereby maintaining the power dissipation and resistive components within said multivibrator circuit at a minimum.

4. The circuit according to claim 3 wherein said emitter electrode of said emitter-follower transistor is directly connected to the base electrode of one of said first and second holding transistors.

5. A clocked bistable multivibrator circuit having set and reset conductive states, said circuit including in combination first and second signal output transistors and first and second holding transistors, said first and second holding transistors connected to a common current output terminal, a common emitter resistance connected between said common current output terminal and a voltage supply means, means cross-coupling said first and second signal output transistors to said second and first holding transistors, respectively, and providing a conductive path in said multivibrator during the alternate conduction of said first and second holding transistors, said cross-coupling means including a first resistance means connected between said first signal output transistor and said voltage supply means and a second resistance means connected between said second signal output transistor and said voltage supply means, and current mode switching means including set and reset transistor means, each connectable to a source of binary logic signals, first and second clocking transistor means connected respectively in parallel with said set and reset transistor means and each connectable to a source of clock signals, said voltage supply means connected to said set and reset transistor means and connected to said first and second clocking transistor means, a first output emitter-follower transistor connected between said set transistor means and a point of reference potential, said first emitter-follower transistor having the emitter electrode thereof connected directly to said first resistance means, a second output emitter-follower transistor connected between said reset transistor means and said point of reference potential, said second output emitter-follower transistor having the emitter electrode thereof connected directly to said second resistance means, said first and second output emitter-follower transistors sharing a common emitter resistance with said first and second signal output transistors respectively, whereby the number of resistive components and the power dissipation in said clocked multivibrator circuit is maintained at a minimum.

6. In a clocked bistable multivibrator circuit having first and second emitter-following transistors cross-coupled to first and second holding transistors to provied bistable switching action, the improvement comprising a common emitter resistance connected between a common output terminal of the holding transistors and a voltage supply means, a first resistance means connected between one of the emitter-follower transistors and said voltage supply means and having an intermediate tap thereon connected to one of the holding transistors, a second resistance means connected between the other of the two emitter-follower transistors and the voltage supply means and having an intermediate tap thereon connected to the other of the two holding transistors, and current mode gating means including an output emitter-follower transistor conductively controlled by a source of clock signals, said output emitter-follower transistor having an output electrode connected directly to the intermediate tap on one of said resistance means in an emitter-follower configuration which enables one of the first and second resistance means to simultaneously serve as an emitter-follower resistance for said output emitter-follower transistor and an emitter-follower and bias resistor for one of said first and second emitter-follower transistors thereby maintaining the overall power dissipation in said multivibrator circuit at an absolute minimum.

References Cited by the Examiner

UNITED STATES PATENTS

| | | | |
|---|---|---|---|
| 3,143,669 | 8/1964 | Gavern et al. | 307—88.5 |
| 3,145,342 | 8/1964 | Hill. | |

ARTHUR GAUSS, *Primary Examiner.*

J. JORDAN, *Assistant Examiner.*